(12) United States Patent
Glidden et al.

(10) Patent No.: US 6,982,482 B2
(45) Date of Patent: Jan. 3, 2006

(54) PACKAGING OF SOLID STATE DEVICES

(75) Inventors: Steven C. Glidden, Freeville, NY (US); Howard D. Sanders, Ithaca, NY (US)

(73) Assignee: Applied Pulsed Power, Inc., Ithaca, NY (US)

( * ) Notice: Subject to any disclaimer, the term of this patent is extended or adjusted under 35 U.S.C. 154(b) by 0 days.

(21) Appl. No.: 10/785,345

(22) Filed: Feb. 24, 2004

(65) Prior Publication Data
US 2005/0184383 A1 Aug. 25, 2005

(51) Int. Cl.
| H01L 23/12 | (2006.01) |
| H01L 23/34 | (2006.01) |
| H01L 23/053 | (2006.01) |
| H01L 21/48 | (2006.01) |
| H01L 21/44 | (2006.01) |

(52) U.S. Cl. ............ 257/723; 257/678; 257/693; 257/701; 257/778; 257/787; 257/712; 438/107; 438/108; 438/110; 438/124; 438/127

(58) Field of Classification Search ............ 257/685, 257/686, 723, 777, 778, 666, 700, 730, 701, 257/787, 678, 693, 712; 438/107, 108, 110, 438/124, 127
See application file for complete search history.

(56) References Cited

U.S. PATENT DOCUMENTS

| 5,155,661 A | * | 10/1992 | Nagesh et al. ............ 361/715 |
| 5,973,932 A | * | 10/1999 | Nguyen ..................... 361/779 |
| 6,020,629 A | * | 2/2000 | Farnworth et al. .......... 257/686 |
| 6,165,820 A | * | 12/2000 | Pace ............................ 438/125 |
| 6,566,750 B1 | | 5/2003 | Sofue et al. ................. 257/723 |
| 6,597,063 B1 | | 7/2003 | Shimizu et al. ............. 257/687 |
| 6,597,585 B2 | | 7/2003 | Ferber et al. ............... 361/820 |
| 6,624,684 B2 | | 9/2003 | Glidden ....................... 327/438 |
| 6,627,987 B1 | | 9/2003 | Glenn et al. ................. 257/704 |
| 6,639,315 B2 | * | 10/2003 | Kazama et al. ............. 257/738 |
| 2003/0205804 A1 | | 11/2003 | Lee et al. .................... 257/703 |

OTHER PUBLICATIONS

K. Chen, T. Nemoto, S. Huang, K. Kitamura, T. Tsuji, T. Fukui, H. Li, and T. Lee, "Novel Packaging Structures, Encapsulation Process and Materials for Matrix Array Over-Molded Flip Chip CSP," Proc. Electr. Pack. Tech. No. 10, (Dec., 10-12, 2003) pp241-244.*
Canfield Technologies, Tech. Bull. No. 124 (2003).*
Hitachi Chemical Co., "Epoxy Molding Compounds," (2003).*

* cited by examiner

Primary Examiner—Nitin Parekh
(74) Attorney, Agent, or Firm—Brown & Michaels, PC

(57) ABSTRACT

A package for one or more solid state devices in a single module that allows for operation at high voltage, high current, or both high voltage and high current. Low thermal resistance between the solid state devices and an exterior of the package and matched coefficient of thermal expansion between the solid state devices and the materials used in packaging enables high power operation. The solid state devices are soldered between two layers of ceramic with metal traces that interconnect the devices and external contacts. This approach provides a simple method for assembling and encapsulating high power solid state devices.

28 Claims, 4 Drawing Sheets

PACKAGING OF SOLID STATE DEVICES

ACKNOWLEDGMENT OF GOVERNMENT SUPPORT

This invention was made with Government support under Grant No. DE-FG02-00ER82948, awarded by the Department of Energy. The government has certain rights in the invention.

BACKGROUND OF THE INVENTION

1. Field of the Invention

The invention pertains to the field of packaging solid state devices. More particularly, the invention pertains to packaging high power solid state devices used to control high voltage, high current, or both high voltage and high current, in areas such as pulsed power for electromagnets, lasers, ion sources, X-ray sources, and other applications.

2. Description of Related Art

Packaging of high power solid state devices, such as diodes, transistors, and thyristors, has to encompass the interconnection of the devices and external contacts, heat dissipation for up to hundreds of watts of heat, and electrical insulation for up to thousands of volts. Typically, these packages include a base, such as a ceramic substrate, solid state devices, wires and other metal contacts connected to the base and the solid state devices, a shell, and encapsulant. Several steps are necessary to assemble these packages. The solid state device and required metal contacts are soldered to the base. The wires are soldered to the base and to the solid state device. The assembly of the base, solid state device, wires, and metal contacts, is placed in a shell. The shell is filled with an encapsulant. An example can be seen in U.S. Pat. No. 6,597,585, which describes a method using a plastic housing and a ceramic substrate. Another example of such packaging methods can be seen in U.S. Pat. No. 6,597,063, describing a packaging method with an integrated heat sink.

This method of packaging is easy for single device modules or simple solid state devices. As the number of interconnections increases, the assembly of the package becomes more difficult. Examples of the increases in complexity include connecting to the gate of a thyristor, or with multiple devices, the interconnection of devices in parallel or in series. An invention describing a packaging method for these more complicated systems can be seen in U.S. Pat. No. 6,566,750, although this packaging method is for a non-insulated power semiconductor module. Another example can be seen in U.S. Pat. No. 6,627,987, in which a packaging method using pockets in a ceramic substrate is described.

U.S. Pat. Application No. 20030205804 describes the manufacture of such packages using a ceramic base and a thin-film circuit layer for the interconnections. This method replaces the wires and other metal contacts used for interconnections with a thin-film circuit layer, significantly reducing problems associated with assembling wires and other metal contacts in these packages. The advances in creating thin-film circuit layers using deposition and lithography techniques developed for semiconductor manufacturing allow this procedure to easily interconnect complex packages of solid state devices. However, such methods increase the cost in time and material.

Whatever method is used to package high power solid state devices, it is important to consider electrical insulation, impedance, and inductance. The package has to insulate above the maximum operating voltage to prevent breakdown and shorting, resulting in damage to the package. Selecting appropriate insulating material is important. Also, the impedance of the electrical connections internal and external to the package must be kept as low as possible to prevent power loss and additional heating in those connections. Power loss reduces efficiency while heating can cause localized stress. Lastly, the inductance of the interconnections must also be kept as low as possible to prevent large induced voltages in the electrical connections. These large induced voltages occur during rapid changes in current conduction versus time and can cause solid state devices to improperly change state, from conducting to non-conducting or from non-conducting to conducting. High interconnection inductance increases the trigger system requirements and limits applications for the devices. Therefore, properly designed packages maximize electrical insulation while minimizing the electrical impedance and inductance of the electrical connections.

Another important issue for packaging solid state devices is to prevent the exposure of the solid state devices to an oxidizing environment, both during the packaging and in use. To prevent oxidation during packaging, the packaging environment is controlled by using vacuum or inert gas atmosphere. These conditions prevent oxidizing agents such as oxygen and water from affecting components during the packaging. To prevent oxidation after packaging, the packaging materials are selected to prevent the oxidizing agents from migrating to the components inside the package. For example, hardened encapsulants can act as a hermetic seal, significantly slowing the migration of oxygen and water to the components internal to the package. By reducing the exposure of the internal components to oxidizing agents, the lifetime of the components is greatly extended.

SUMMARY OF THE INVENTION

The invention is a method of packaging solid state devices capable of high current conduction, high operating voltage, or both high current conduction and high operating voltage. The method of packaging allows for electrical insulation for high voltages, dissipation of large quantities of heat, structural rigidity, long life-time reliability, low cost for manufacturing, and compactness. This method of packaging will allow for more economical assembly of complicated solid state systems. The packaging enables low inductance internal and external connections to enable operation at high rates of current rise versus time.

This method can be used to package diodes, metal-oxide semiconductor field effect transistors (MOSFETs), Bipolar Transistors (BJT), Gate Turn-Off (GTO) thyristors, Insulated Gate Bipolar Transistors (IGBT), and other solid state devices, used to control high voltage, high current, or both high voltage and high current, in areas such as pulsed power for electromagnets, lasers, ion sources, X-ray sources, and other applications. This method is appropriate for packaging the compact high voltage solid state switch described in U.S. Pat. No. 6,624,684.

This invention uses two layers of ceramic substrate, two encapsulants, metal threaded and pin terminals, and metal strip-lines, to package high power solid state devices. The ceramic substrates provide electrical insulation for high voltage and are matched to the coefficient of thermal expansion of the solid state devices. The ceramic substrates have metal pads bonded on both surfaces for mounting the solid state devices and to provide low impedance and low inductance interconnections with separate current paths for control and high current signals. The first encapsulant is matched to the coefficient of thermal expansion of the solid state devices, while both encapsulants provide electrical insulation for high voltage. The ceramic substrates, the solid state devices, the threaded terminals, and the metal strip-lines, are soldered together into one assembly. This assembly is then encapsulated with the first encapsulant into one unit. This unit is encapsulated by the second encapsulant into the final module.

The apparatus includes at least one solid state device including a plurality of metal contacts, a first ceramic substrate including a metal pad on a first side, and on a second side at least one metal pad, equal in number to the solid state devices packaged, facing the solid state device, and soldered to metal contacts of the solid state device, a second ceramic substrate having a plurality of metal pads and vias on a first side, and on a second side a plurality of metal pads, facing the solid state device and soldered to metal contacts of the solid state device, a plurality of metal threaded terminals and pin terminals to assemble the ceramic substrates, a first encapsulant to encapsulate the solid state device between the ceramic substrates, and a second encapsulant to cover the first side of the second ceramic substrate.

The method of packaging includes providing at least one solid state device including a plurality of metal contacts, providing a first ceramic substrate having a metal pad on a first side, and on a second side a number of metal pads equal to the number of solid state devices packaged, providing a second ceramic substrate including a plurality of metal pads and vias on a first side, and on a second side a plurality of metal pads to connect to metal contacts of the solid state device, placing the solid state device between the second side of the first ceramic substrate and the second side of the second ceramic substrates, assembling the solid state device and the ceramic substrates using a plurality of metal threaded terminals and a plurality of pin terminals, wherein the metal pads of the ceramic substrates match the metal contacts of the solid state devices, soldering the solid state device, the threaded terminals, and the metal strip-lines, are soldered together into one assembly between the metal pads and metal contacts, encapsulating the solid state device between the two ceramic substrates under vacuum using a mold and a high dielectric strength encapsulant, and encapsulating the assembly using a mold, wherein the second encapsulant is rigid and insulating for high voltage and covers the first side of the first ceramic substrate.

DETAILED DESCRIPTION OF THE INVENTION

Figure 2:
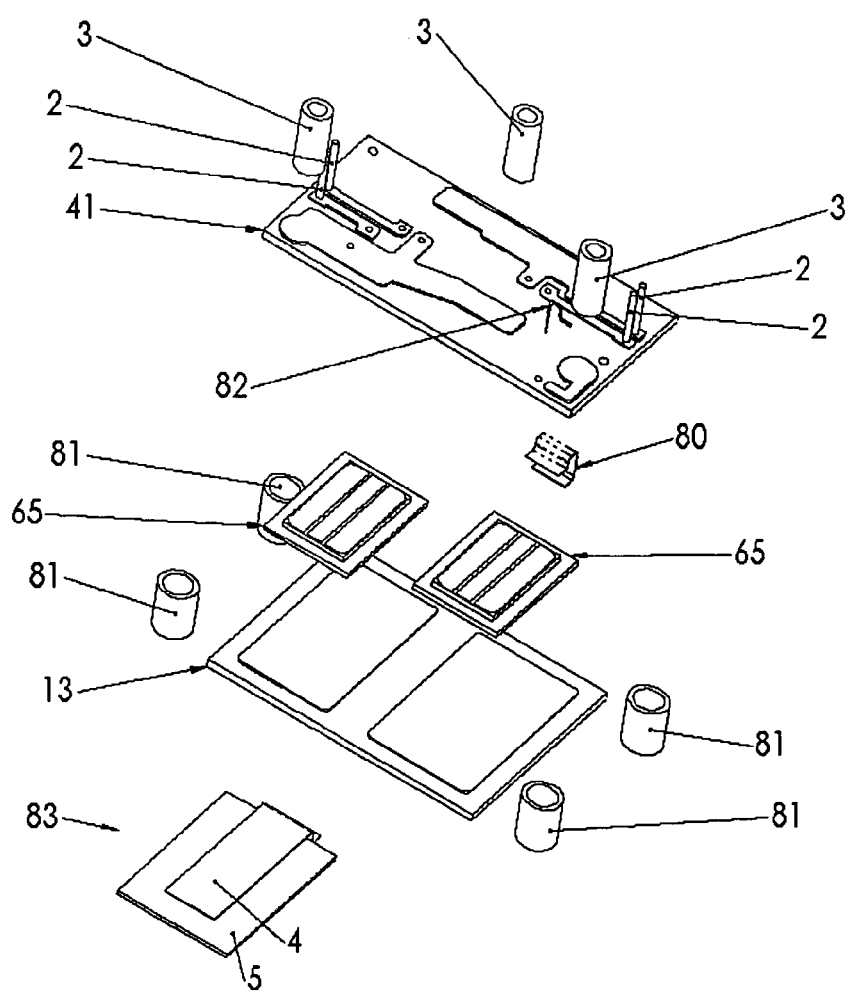
FIG. 2 shows an exploded view of the assembly of the example package.

One example of the method of packaging of solid state devices of this invention is depicted in FIG. 2. It comprises one or more solid state devices 65, two layers of metallized ceramic substrate 13, 41, two encapsulants 6, 9, metal threaded 3 and pin terminals 2, and metal strip-lines 83. Ceramic substrates 13, 41 are used because of ceramic's excellent electrical insulating properties, high thermal conductivity and low thermal coefficient of expansion. The encapsulants 6, 9 provide further electrical insulation over the rest of the package while also preventing exposure of the components to oxidizing agents and providing structural rigidity and durability. Metal threaded 3 and pin terminals 2 are used to provide low power electrical connections to external circuits.

Figure 3:
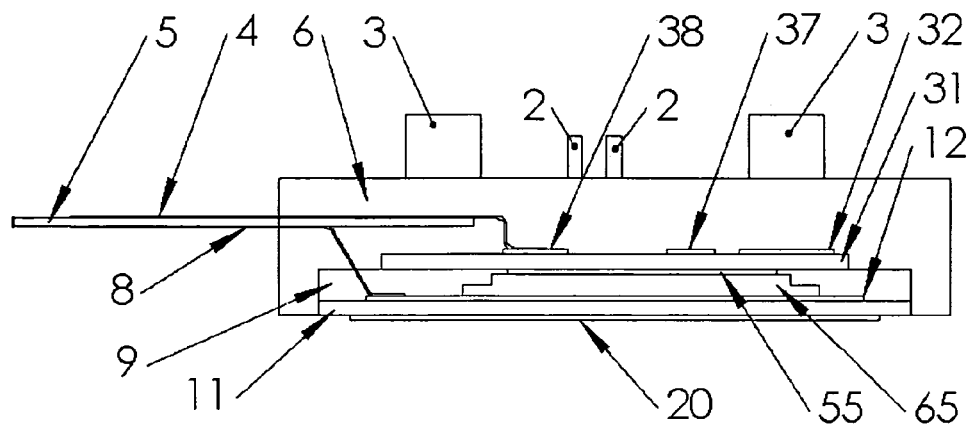
FIG. 3 shows a sectional view of the example package, along the lines 3—3 in FIG. 1.

The strip-line 83 can also be seen in the sectional view of FIG. 3. The strip-line consists of conductive strips 4, 8 separated by an insulator 5 with a high dielectric strength, such as Kapton, and are used to provide low inductance and low impedance high power electrical connections. Other electrical connections, such as the wire jumper 82 and the metal strip 80 are used as needed to connect the two layers of metallized ceramic substrate 13, 41.

Figure 4:
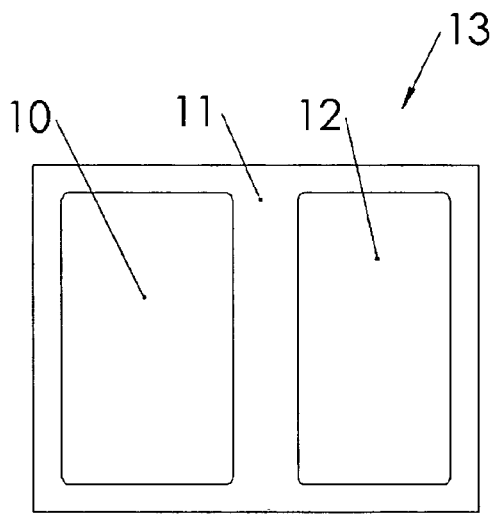
FIG. 4 shows an example of the top of a base ceramic substrate used in the example package.
Figure 5:
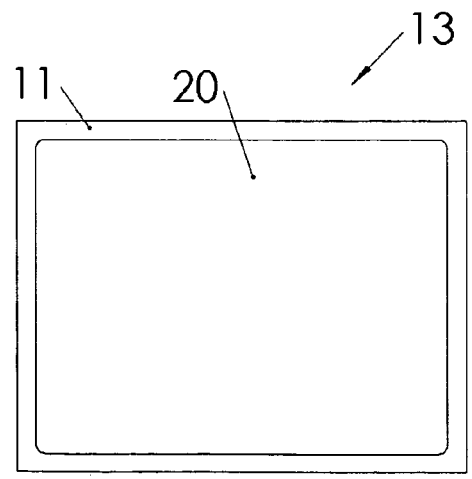
FIG. 5 shows an example of the bottom of a base ceramic substrate used in the example package.

One metallized ceramic substrate 13, seen in FIG. 4 and FIG. 5, will normally be in contact with a heat sink. The ceramic 11 should have a low thermal resistance and a coefficient of thermal expansion close to that of the solid state devices 65. Aluminum Nitride is typically used with silicon devices. On one side of this ceramic 11 a metal pad 20 nearly the size of the ceramic is bonded to the ceramic 11. This pad 20 is normally placed in contact with a heat sink to allow for the dissipation of heat generated by the high power solid state devices 65. Bonded to the other side of the ceramic 11 are a number of metal pads 10, 12, equivalent to the number of solid state devices 65 in the package. These pads are larger than the solid state device associated with the specific pad. Direct bond copper, with a nickel coating and a gold flash, is one means used to provide the metal pads 10, 12, 20. Active metal braze and other techniques can be used. The thickness of the ceramic 11 must be sufficient to withstand the potential difference between the pads 10, 12 associated with the solid state devices 65 and the potential of the pad 20 in contact with the heat sink. By placing a selected bias potential on this pad 20, the electric field across the ceramic 11 can be reduced, improving the lifetime of this component. The distance between pads 10, 12 associated with the solid state devices 65 must be sufficient to prevent breakdown between the solid state devices 65.

Figure 6:
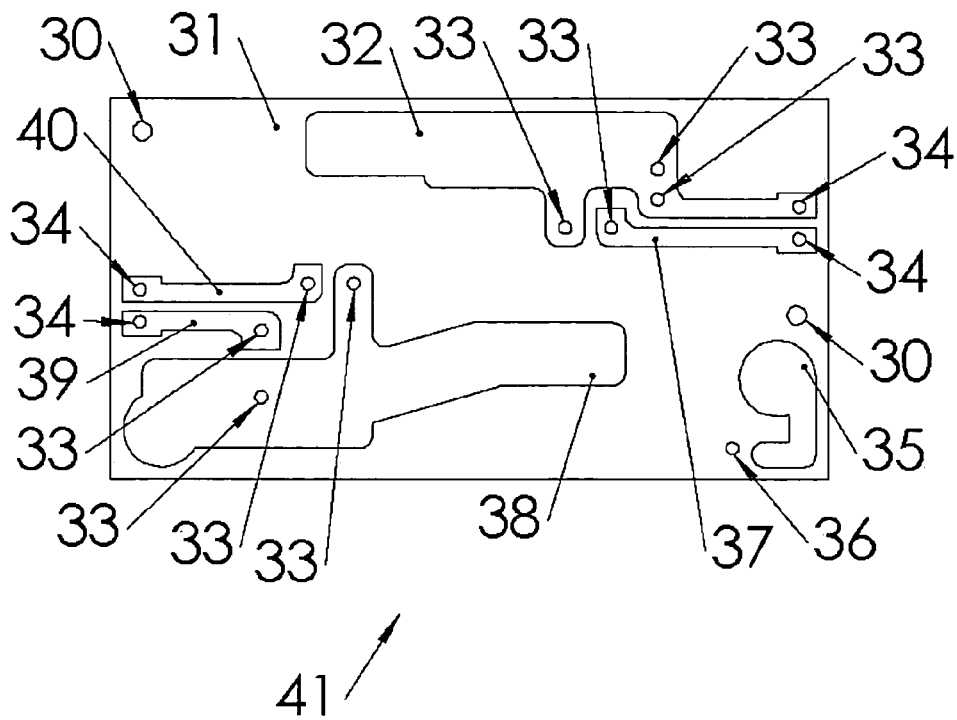
FIG. 6 shows an example of the top of a cap ceramic substrate used in the example package.
Figure 7:
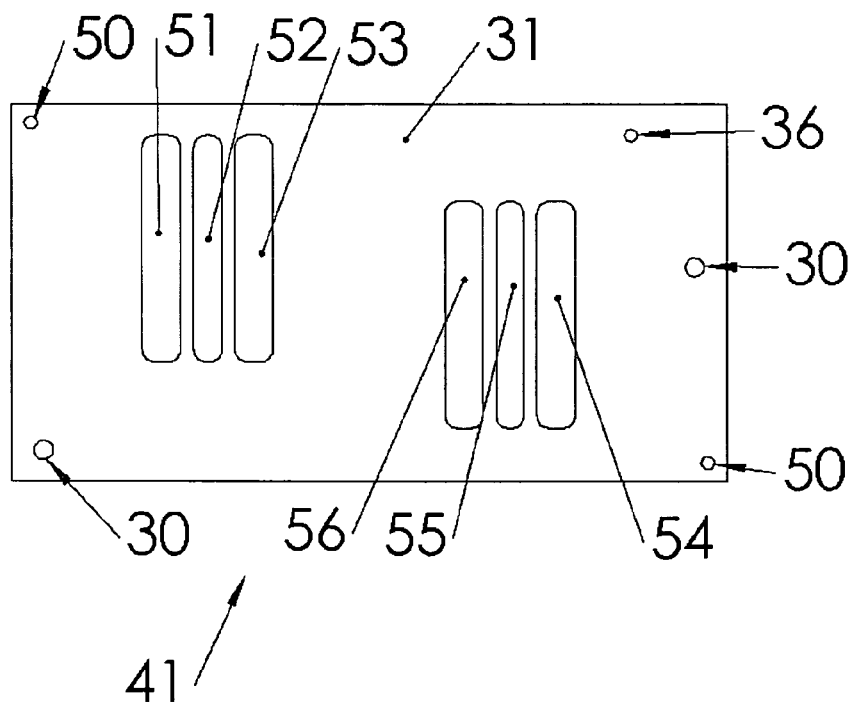
FIG. 7 shows an example of the bottom of a cap ceramic substrate used in the example package.

The second metallized ceramic substrate 41 is shown in FIG. 6 and FIG. 7. This piece of ceramic 31 should have a coefficient of thermal expansion close to that of the solid state devices 65. Since there is less need for low thermal resistance and to reduce cost, this piece of ceramic 31 is typically Aluminum Oxide.

Figure 8:
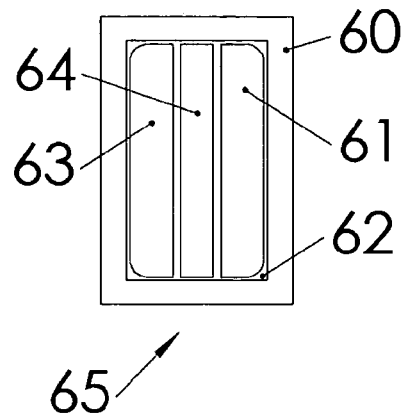
FIG. 8 shows an example of a solid state device, specifically the thyristor used in the example package.

Bonded to one side of this ceramic substrate 31 are a series of pads 51, 52, 53, 54, 55, 56 which are designed to connect to specific points 61, 63, 64 on specific solid state devices 65, shown in FIG. 8. Bonded to the other side of this ceramic substrate 31 are pads 32, 35, 37, 38, 39, 40 that provide interconnections between solid state devices 65 and external contacts 2, 3, 4. Again, direct bond copper, with a nickel coating and a gold flash, can be used to provide the metal pad.

There are metal filled vias 33 through the ceramic substrate connecting the pads on one side to pads on the other.

Additionally, there are holes 30 through this ceramic 31 located near opposite edges to provide for aligning parts during assembly. Other holes 34, 36 through this ceramic 31 or additional pads 35, 50 bonded to this ceramic substrate 31 may be used depending on the type of solid state device and the requirements for assembly.

For both pieces of ceramic, the number, shape, and location, for all of the pads, vias, and holes, are established to provide low impedance and low inductance interconnections and to separate control signal current paths from high current paths. The latter is particularly important for switching applications that result in a high rate of current rise versus time.

Packaging of the high power solid state devices 65 starts by assembling the solid state devices 65, the ceramic substrates 13, 41, the metal threaded and pin terminals 2, 3, and the metal strip-lines 83. This can be done using an automated placement device. The solid state devices 65 are placed between the-two ceramic substrates 13, 41, matching the pads 51, 52, 53, 54, 55, 56 on the ceramic substrate 41 to metallic contacts 61, 63, 64 on the solid state devices 65. Between each contact and pad is placed a layer of solder. The entire assembly is run through an; environmentally controlled solder re-flow oven. This bonds the components together while preventing oxide layers from forming. The temperatures and environments are controlled to reduce stress on the assembly before, during, and after the parts are bonded together. This assembly is then cleaned to remove flux and other debris.

Next, the assembly is encapsulated. On one side of the assembly is the first ceramic substrate 13 with the large pad 20 facing out from the assembly. The large pad 20 is placed against one part of a mold using a removable adhesive sealant such as Room Temperature Vulcanizing (RTV). The structure is then sealed against the second part of the mold. The assembled mold is vacuum filled with the first encapsulant 9, such as a one component epoxy resin, from the first ceramic substrate 13 to above the second ceramic substrate 41. The vacuum fill is important to remove the air prior to the introduction of the encapsulant 9 so as to reduce the probability of air bubbles trapped inside the encapsulant 9. The encapsulant 9 typically has a high dielectric strength but its electrical insulation capability is greatly reduced by the presence of air bubbles in the hardened encapsulant 9. The RTV sealant is important to prevent the encapsulant 9 from seeping over the surface of the side of ceramic substrate 13. The encapsulant 9 needs to have similar coefficient of thermal expansion as the solid state device 65 and the ceramic substrates 13, 41. It is also useful for this encapsulant 80 to have low thermal resistance. An example of such an encapsulant would be Dexter Hysol CB064. This encapsulates the solid state devices 65 between the ceramic substrates 13, 41, producing a volume with all parts having similar coefficients of thermal expansion and low thermal resistance.

The original second part of the mold is removed and the encapsulated unit, still sealed on one part of the mold, is sealed against a different second part of the mold. This assembled mold is now vacuum filled with a second encapsulant 6. This encapsulant 6 must be rigid and insulate for high voltage. It will provide the exterior surface of the package 7. The second encapsulant 6 can have a higher coefficient of thermal expansion and higher thermal resistance and is typically easier to work with and substantially less costly than the first encapsulant 9.

The encapsulation of the package can be done in one step using a single encapsulant for both 6, 9 with a low thermal resistance and a coefficient of thermal expansion similar to the solid state devices 65. This may be more economical if the total volume to be encapsulated is small.

The module 7 is then removed from the mold. The high power solid state devices 65 are now packaged in a way that provides structural rigidity, long-lifetime, low thermal resistance, is compact, insulates for high voltage, and is low cost for manufacturing.

Alternatively, as mentioned above in the discussion of the prior art, instead of pouring a second encapsulant with a second mold step, the exterior of the package can instead be formed by a solid piece, called a shell, which could also act as part of the mold for the pour of the first encapsulant. The shell can also be filled with the second encapsulant. This would provide the same effect of increased electrical insulation and rigidity as the second mold step, above.

Figure 1:
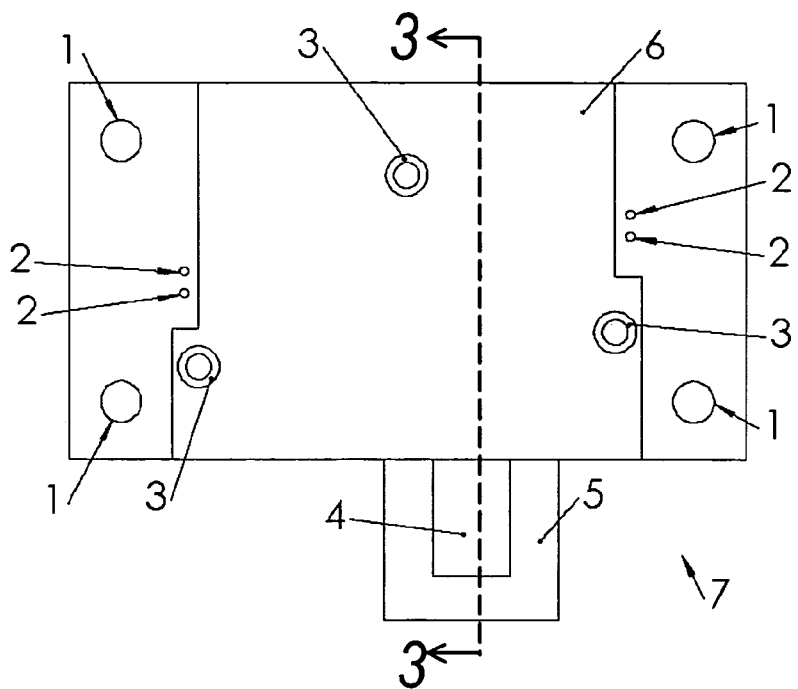
FIG. 1 shows an example of packaged solid state devices, specifically of a two thyristor high voltage and high current switch.

An example of an assembled package 7 can be seen in FIG. 1. This package 7 is a high voltage and high current switch designed to operate at a peak current of 6000 amperes and a maximum stand-off voltage of 8000 volts. The solid state devices 65 in this switch are silicon 60 based thyristors with a ceramic lid 62, which has two cathode 61, 63 and one gate 64 metal contacts. By using ceramic 11, 31, 62 and encapsulant 80 with similar coefficients of thermal expansion to the silicon 60, there is less stress on the components during thermal cycling. In this case, the ceramic 11 of the first ceramic substrate 13 is aluminum nitride and the ceramic 31 of the second ceramic substrate 41 is aluminum oxide. The designs of the ceramic substrates 13, 41 assure electrical insulation for voltages higher than the maximum stand-off voltage of the switches. Two sets of pin terminals 2 on the cap ceramic provide the gate and gate return electrical connections from the two thyristors 65 to an external circuit. Separating the gate return connection from cathode connection reduces even further the effects of high induced voltages on the solid state device 65. The three threaded terminals 3 provide electrical connections from the anode and cathode potentials for the two thyristors 65 to an external circuit. As the thyristors 65 are in series, the anode of one of the thyristors 65 is at the same potential as the cathode of the other thyristor 65. These terminals 2, 3 are easily connected to the self powered trigger circuit as described in U.S. Pat. No. 6,624,684. The package 7 mounts to a standard heat sink 71 using four through holes 1 at the corners of the package 7. To add rigidity to those mounting holes, fiberglass inserts 81 are used.

Figure 9:
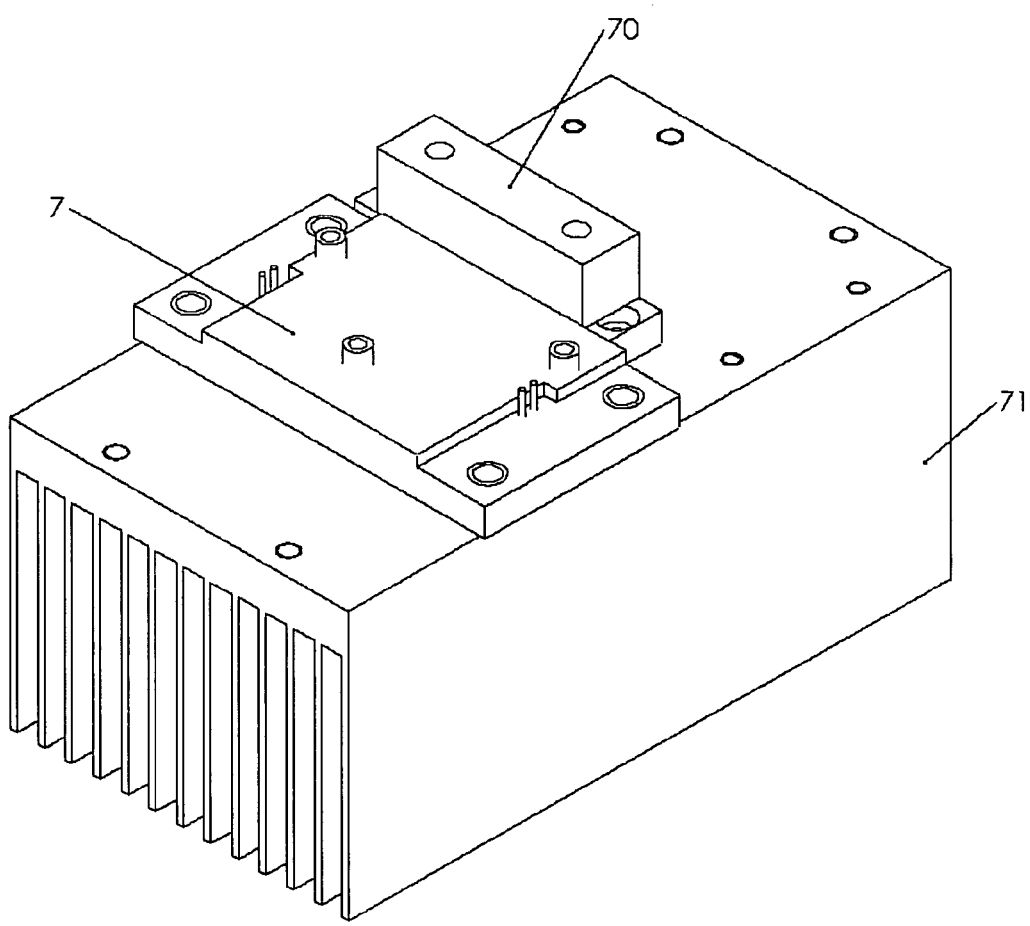
FIG. 9 shows an illustration of mounting the example package on to a heat sink.

As seen in FIG. 9, this example switch package 7 can be used by clamping a mating strip-line 70 to the external strip-line 4 of the package 7. The package 7 is mounted to a heat sink 71, making sure to properly join the heat sink 71 to the pad 20 on the bottom of the first ceramic substrate 13, if necessary with a thermal joint compound. The heat sink 71 is then biased at a potential equivalent to the anode potential of either one of the two thyristors 65 to minimize the peak electric field in the ceramic substrate. The external trigger circuit then mounts on to the terminals. The example switch is now ready for high power operation.

Accordingly, it is to be understood that the embodiments of the invention herein described are merely illustrative of the application of the principles of the invention. Reference herein to details of the illustrated embodiments is not intended to limit the scope of the claims, which themselves recite those features regarded as essential to the invention.

What is claimed is:

1. A packaged solid state assembly comprising:
   a) a first ceramic substrate and a second ceramic substrate and at least one solid state device located therebetween, each solid state device comprising a body having a coefficient of thermal expansion and a plurality of conductive contacts on a surface of the body facing the second ceramic substrate;
b) the first ceramic substrate comprising:
a body having a coefficient of thermal expansion matched to the coefficient of thermal expansion of at least one solid state device, a lower side and an upper side facing the solid state devices;
a conductive pad covering the lower side; and
one conductive pad connected to each of the solid state devices packaged, each conductive pad being bonded to the upper side of the body and connected to the solid state device with which it is associated, each pad being separated from other metal pads by a distance sufficient to prevent breakdown;
c) a second ceramic substrate comprising:
a body having a coefficient of thermal expansion matched to the coefficient of thermal expansion of at least one solid state device, a lower side facing the solid state devices, and an upper side;
a plurality of conductive pads bonded to the upper side of the body, and
a plurality of conductive pads bonded to the lower side of the body, at least one pad for each contact on the solid state devices, facing the solid state devices and connected to the conductive contacts of the solid state device; and
a plurality of vias connecting at least some of the conductive pads on the lower side of the body to at least one of the conductive pads on the upper side of the body;
d) a plurality of terminals connected to the conductive pads on the upper surface of the second ceramic substrate;
e) a strip line comprising an insulating body, a first conductive strip and a second conductive strip, the first conductive strip being connected to a conductive pad on the first ceramic substrate or the second ceramic substrate, and the second conductive strip being connected to a different conductive pad on the first ceramic substrate or the second ceramic substrate; and
f) a first encapsulant having a coefficient of thermal expansion matched to the coefficient of thermal expansion of at least one solid state device, encapsulating the solid state devices between the first ceramic substrate and the second ceramic substrate.

2. The assembly of claim 1, wherein the first ceramic substrate is made of aluminum nitride.

3. The assembly of claim 1, wherein the second ceramic substrate is made of aluminum oxide.

4. The assembly of claim 1, further comprising a second encapsulant covering all of the assembly except for the lower side of the first ceramic substrate and ends of the terminals opposite the second ceramic substrate.

5. The assembly of claim 1, further comprising a shell covering all of the assembly except for the lower side of the first ceramic substrate and ends of the terminals opposite the second ceramic substrate.

6. The assembly of claim 5, further comprising a second encapsulant inside the shell.

7. The assembly of claim 1, further comprising a heat sink coupled to the lower side of the first ceramic substrate.

8. The assembly of claim 1, further comprising at least one conductor connecting a conductive pad on the first ceramic substrate and a conductive pad on the second ceramic substrate.

9. A package for at least one solid state device, each solid state device comprising a body having a coefficient of thermal expansion and a plurality of conductive contacts, the package comprising:
a) a first ceramic substrate and a second ceramic substrate, spaced apart a sufficient distance for at least one solid state device to be located therebetween, the conductive contacts on the solid state device facing the second ceramic substrate;
b) the first ceramic substrate comprising:
a body having a coefficient of thermal expansion matched to the coefficient of thermal expansion of at least one solid state device, a lower side and an upper side facing the solid state devices;
a conductive pad covering the lower side; and
one conductive pad for each of the solid state devices packaged, each conductive pad being bonded to the upper side of the body and located so as to be adjacent to the solid state device with which it is associated, each pad being separated from other metal pads by a distance sufficient to prevent breakdown;
c) a second ceramic substrate comprising:
a body having a coefficient of thermal expansion matched to the coefficient of thermal expansion of at least one solid state device, a lower side facing the solid state devices and an upper side;
a plurality of conductive pads bonded to the upper side of the body, and
a plurality of conductive pads bonded to the lower side of the body, at least one pad for each contact on the solid state devices, facing the solid state devices and connected to the conductive contacts of the solid state device; and
a plurality of vias connecting at least some of the conductive pads on the lower side of the body to at least one of the conductive pads on the upper side of the body;
d) a plurality of terminals connected to the conductive pads on the upper surface of the second ceramic substrate; and
e) a strip line comprising an insulating body, a first conductive strip and a second conductive strip, the first conductive strip being connected to a conductive pad on the first ceramic substrate or the second ceramic substrate, and the second conductive strip being connected to a different conductive pad on the first ceramic substrate or the second ceramic substrate; and
such that when at least one solid state device is mounted in the package, the space between the first ceramic substrate and the second ceramic substrate is filled with a first encapsulant having a coefficient of thermal expansion matched to the coefficient of thermal expansion of at least one solid state device, encapsulating the solid state devices.

10. The package of claim 9, wherein the second ceramic substrate is made of aluminum oxide.

11. The package of claim 9, wherein the first ceramic substrate is made of aluminum nitride.

12. The package of claim 9, further comprising a second encapsulant covering all of the assembly except for the lower side of the first ceramic substrate and ends of the terminals opposite the second ceramic substrate.

13. The package of claim 9, further comprising a shell covering all of the assembly except for the lower side of the first ceramic substrate and ends of the terminals opposite the second ceramic substrate.

14. The package of claim 13, further comprising a second encapsulant inside the shell.

15. The package of claim 9, further comprising a heat sink coupled to the lower side of the first ceramic substrate.

16. The package of claim 9, further comprising at least one conductor connecting a conductive pad on the first ceramic substrate and a conductive pad on the second ceramic substrate.

17. A method of packaging at least one solid state device, each solid state device comprising a body having a coefficient of thermal expansion and a plurality of conductive contacts, using a first ceramic substrate and a second ceramic substrate; the method comprising the steps of:
   a) providing a second ceramic substrate comprising:
      a body having a coefficient of thermal expansion matched to the coefficient of thermal expansion of at least one solid state device, a lower side and an upper side;
      a plurality of conductive pads bonded to the upper side of the body, and
      a plurality of conductive pads bonded to the lower side of the body, at least one pad for each contact on the solid state devices,
      a plurality of vias connecting at least some of the conductive pads on the lower side of the body to at least one of the conductive pads on the upper side of the body;
   b) placing the solid state devices on the lower side of the second ceramic substrate, with the contacts of the solid state devices in alignment with the conductive pads on the lower side of the second ceramic substrate;
   c) connecting the contacts of the solid state device to the conductive pads on the lower side of the second ceramic substrate;
   d) assembling the connected solid state devices and second ceramic substrate with a first ceramic substrate comprising:
      a body having a coefficient of thermal expansion matched to the coefficient of thermal expansion of at least one solid state device, a lower side and an upper side;
      a conductive pad covering the lower side; and
      one conductive pad for each of the solid state devices to be packaged, each conductive pad being bonded to the upper side of the body and located adjacent to the solid state device with which it is associated, each pad being separated from other metal pads by a distance sufficient to prevent breakdown;
   e) connecting the conductive pads on the upper side of the first ceramic substrate to the solid state devices;
   f) connecting a plurality of terminals to the conductive pads on the upper surface of the second ceramic substrate;
   g) connecting a strip line comprising an insulating body, a first conductive strip and a second conductive strip, to the conductive pads on the first ceramic substrate and the second ceramic substrate; and
   h) filling the space between the first ceramic substrate and the second ceramic substrate with a first encapsulant having a coefficient of thermal expansion matched to the coefficient of thermal expansion of at least one solid state device, encapsulating the solid state devices using a mold.

18. The method of claim 17, in which the filling step (h) encapsulating the solid state device between the two ceramic substrates is done under vacuum using a mold.

19. The method of claim 17, further comprising the step, after step (h) of:
   i) encapsulating the assembled upper side of the first ceramic substrate, the second ceramic substrate, solid state devices, strip line, and terminals in a second encapsulant using a mold, leaving the lower side of the first ceramic substrate, an outer portion of each of the terminals and an outer portion of the strip line free of encapsulant.

20. The method of claim 19, in which the encapsulation steps (h) and (i) comprise the steps of:
   1) adhering the conductive pad on the lower side of the second conductive pad against a first part of a mold with a removable adhesive;
   2) sealing the first part of the mold to a second part of the mold, enclosing the first ceramic substrate, solid state devices, second ceramic substrate, and heat sink within the mold;
   3) vacuum filling the mold with the first encapsulant, producing an encapsulated unit with all parts having similar coefficients of thermal expansion;
   4) removing the second part of the mold;
   5) sealing the first part of the mold against a different second half of the mold;
   6) vacuum filling the mold with the second encapsulant forming an encapsulated module; and
   7) removing the module from the mold.

21. The method of claim 19, in which the first encapsulant and the second encapsulant are the same, and encapsulation steps (h) and (i) are combined in the steps of:
   1) adhering the conductive pad on the lower side of the second conductive pad against a first part of a mold with a removable adhesive;
   2) sealing the first part of the mold to a second part of the mold, enclosing the first ceramic substrate, solid state devices, second ceramic substrate, and heat sink within the mold;
   3) vacuum filling the mold with the encapsulant, producing an encapsulated unit with all parts having similar coefficients of thermal expansion;
   4) removing the module from the mold.

22. The method of claim 17, further comprising the step, after step (h) of covering all of the assembly except for the lower side of the first ceramic substrate and ends of the terminals opposite the second ceramic substrate in a shell.

23. The method of claim 22, further comprising the step of filling the shell with a second encapsulant.

24. The method of claim 17, in which the conductive pads on the first ceramic substrate and the contacts of the solid state device, the terminals and the conductive pads second ceramic, and the conductive strips of the strip-line and the conductive pads on the first ceramic substrate and the second ceramic substrate, are connected by placing a layer of solder between each pad and contact and placing the first ceramic substrate, second ceramic substrate, solid state devices, terminals and strip line in a re-flow oven to melt the solder.

25. The method of claim 24, further comprising the step of cleaning to remove flux and other debris.

26. The method of claim 24, further comprising the step of controlling temperature and environment at least during steps (a) through (f) to reduce stress.

27. The method of claim 17, further comprising the step of mounting the first ceramic substrate to a heat sink.

28. The method of claim 17, further comprising the step of connecting at least one conductive pad on the first ceramic substrate to at least one conductive pad on the second ceramic substrate.

* * * * *